(12) United States Patent
Matsui et al.

(10) Patent No.: US 11,520,047 B2
(45) Date of Patent: Dec. 6, 2022

(54) DISTANCE MEASURING DEVICE

(71) Applicants: OMRON Corporation, Kyoto (JP); Politecnico di Milano, Milan (IT)

(72) Inventors: Yuki Matsui, Kyoto (JP); Ken Nakamuro, Kyoto (JP); Franco Zappa, Milan (IT); Federica Villa, Milan (IT); Rudi Lussana, Milan (IT)

(73) Assignees: OMRON Corporation, Kyoto (JP); Politecnico di Milano, Milan (IT)

( * ) Notice: Subject to any disclaimer, the term of this patent is extended or adjusted under 35 U.S.C. 154(b) by 600 days.

(21) Appl. No.: 16/535,126

(22) Filed: Aug. 8, 2019

(65) Prior Publication Data

US 2020/0049822 A1 Feb. 13, 2020

(30) Foreign Application Priority Data

Aug. 9, 2018 (EP) ..................... 18425067

(51) Int. Cl.
*G01S 17/10* (2020.01)
*G01S 7/48* (2006.01)
(Continued)

(52) U.S. Cl.
CPC ............ *G01S 17/10* (2013.01); *G01S 7/4863* (2013.01); *H01L 27/14643* (2013.01); *G01S 7/4868* (2013.01); *H01L 31/107* (2013.01)

(58) Field of Classification Search
CPC ...... G01S 17/10; G01S 7/4863; G01S 7/4868; G01S 7/4816; G01S 7/4865; H01L 27/14643; H01L 31/107
See application file for complete search history.

(56) References Cited

U.S. PATENT DOCUMENTS 7,355,641 B2 * 4/2008 Yamaguchi ........ H04N 9/04557
348/323
11,259,002 B2 * 2/2022 Le Dortz .............. G01S 17/894
(Continued)

FOREIGN PATENT DOCUMENTS

EP  2708913 A1  3/2014
EP  3182154 A1  6/2017
(Continued)

OTHER PUBLICATIONS

The extended European search report (EESR) dated Feb. 15, 2019 in a corresponding European patent application.
(Continued)

*Primary Examiner* — Seung C Sohn
(74) *Attorney, Agent, or Firm* — Metrolex IP Law Group, PLLC

(57) ABSTRACT

A distance measuring device includes a light emission portion configured to emit light; a light receiving portion configured to receive measurement light that is emitted by the light emission portion and reflected by the measurement object, the light receiving portion comprising a plurality of pixels configured to output light reception signals that depend on the received measurement light; a plurality of determination portions configured to receive the light reception signals and to determine characteristic values from the received light reception signals, and an evaluation portion that is connected to the plurality of determination portions, the evaluation portion being configured to calculate a distance from the characteristic values determined by the determination portions. Each of the plurality of determination portions is configured to receive the light reception signals only from a plurality of non-adjacent pixels.

11 Claims, 7 Drawing Sheets

(51) Int. Cl.
*H01L 27/146* (2006.01)
*H01L 31/107* (2006.01)
*G01S 7/4863* (2020.01)
*G01S 7/486* (2020.01)

(56) References Cited

U.S. PATENT DOCUMENTS

| | | | |
|---|---|---|---|
| 2012/0249998 A1 | 10/2012 | Eisele et al. | |
| 2012/0261547 A1* | 10/2012 | Eisele | G01J 1/0448 250/201.1 |
| 2012/0262696 A1* | 10/2012 | Eisele | G01S 7/4863 356/4.01 |
| 2013/0300938 A1* | 11/2013 | Leme | H03D 7/166 348/607 |

FOREIGN PATENT DOCUMENTS

| | | |
|---|---|---|
| EP | 3318895 A1 | 5/2018 |
| EP | 3608688 B1 | 1/2021 |
| JP | H09-297057 A | 11/1997 |
| JP | 2007-526453 A | 9/2007 |
| JP | 2009-79988 A | 4/2009 |
| JP | 2012-93312 A | 5/2012 |
| JP | 2014-59301 A | 4/2014 |
| JP | 2014-59302 A | 4/2014 |
| JP | 2015-127663 A | 7/2015 |
| JP | 2017-72532 A | 4/2017 |
| JP | 2018-59898 A | 4/2018 |
| JP | 2018-537680 A | 12/2018 |
| JP | 6873440 B2 | 5/2021 |
| WO | 2011/029645 A1 | 3/2011 |
| WO | 2011029645 A1 | 3/2011 |

OTHER PUBLICATIONS

The Office Action dated Aug. 19, 2020 in a counterpart Japanese patent application.

* cited by examiner ved by a measurement object, the light receiving portion comprising a plurality of pixels configured to output light reception signals that depend on the received measurement light;

DISTANCE MEASURING DEVICE

FIELD OF THE INVENTION

The present invention relates to a distance measuring device, and more specifically to a distance measuring device comprising a light receiving portion having a plurality of pixels.

TECHNICAL BACKGROUND

Sensors that detect the distance to an object are known, in which measurement light is incident on a light reception area constituted by an array of light reception elements or pixels. The distance detecting resolution of such a sensor can be increased by increasing the number of light reception elements. However, if the number of light reception elements is increased, then also a corresponding evaluation circuitry for evaluating the signals generated by the light reception elements needs to be provided. This evaluation circuitry becomes larger, the more light reception elements there are.

If an evaluation circuit is provided for each light receiving element, then the required space becomes large. It is possible to group several light reception elements together and provide only one evaluation circuit for each group of light reception elements, but in this case, the resolution will decrease. For example, EP 2 708 913 A1 shows an optoelectronic sensor comprising a light reception area with an array of photon avalanche diodes serving as light reception elements. Adjacent photon avalanche diodes are connected to a single processing device for processing signals received from the photon avalanche diodes.

US 2012/0262696 A1 discloses a measuring device for optically measuring a distance to a target object including an emitter device for emitting an optical measuring beam to the target object, a capturing device comprising a detection surface for detecting an optical beam returned by the target object, and an evaluation device. The detection surface has a plurality of pixels, each pixel having at least one light-sensitive element and each of the plurality of pixels is connected to the evaluation device. The emitting device and the capturing device are configured in such a manner that the optical measurement beam returned by the target object simultaneously illuminates a plurality of pixels. The evaluation device is configured in such a manner that detection signals of a plurality of pixels are guided to at least one of the plurality of distance determining devices.

It is an object of the present invention to provide a distance measuring device, in which a high resolution can be attained while reducing the required space for the evaluation circuitry.

SUMMARY OF THE INVENTION

According to one aspect of the invention, a distance measuring device for determining a characteristic of a measurement object is provided. The distance measuring device comprises:
a light emission portion configured to emit light;
a light receiving portion configured to receive measurement light that is emitted by the light emission portion and reflected by a measurement object, the light receiving portion comprising a plurality of pixels configured to output light reception signals that depend on the received measurement light;
a plurality of determination portions configured to receive the light reception signals and to determine characteristic values from the light reception signals;
an evaluation portion that is connected to the plurality of determination portions, the evaluation portion being configured to calculate a distance from the characteristic values determined by the determination portions,
wherein each of the plurality of determination portions is configured to receive the light reception signals only from a plurality of non-adjacent pixels. Non-adjacent pixels can be non-neighboring pixels having at least one other pixel arranged between them. In particular, there is no direct path between non-adjacent pixels that does not cross any other pixel provided between the non-adjacent pixels. Each of the plurality of determination portions may be configured to receive the light reception signals from a plurality of non-adjacent pixels simultaneously. That is to say, each of the determination portions may be conductively connected to a plurality of non-adjacent pixels concurrently, so that it can receive the output from any of those non-adjacent pixels.

There may be less determination portions than pixels. In particular, each determination portion is associated with plurality of pixels. The number of determination portions can be reduced as compared to an arrangement in which every pixel has a determination portion associated thereto. Thereby, the cost of the distance measuring device can be reduced. Further the space requirement for the determination portions can be reduced, in particular leading to a smaller distance measuring device. Such a reduced space requirement can also reduce the power dissipation and the need of a scaled technology.

In addition, associating only non-adjacent pixels with a single determination portion can be advantageous because the distinction between light reception signals from different pixels is thereby facilitated and the resolution of the processed signals can be improved.

One pixel may comprise one or more light receiving elements that are adjacent and the output of which is input into the same determination portion. More specifically, each light receiving element may be a single photon avalanche diode. The light receiving elements may also be analog detectors, such as photodiodes, avalanche photodiodes (APDs) and/or silicon photomultipliers (SiPMs).

Each of the plurality of pixels may have the same size. If all pixels have the same size, then the layout of the pixels becomes easier, thus reducing the manufacturing costs.

According to a further aspect, the plurality of pixels may be arranged in an array comprising at least one row; the pixels of each row may constitute N pixel groups; the pixels of each pixel group may be connected to the same determination portion; and the pixels from each pixel group may be arranged such that N−1 pixels of other pixel groups are located between neighboring pixels of the same pixel group. In other words, the pixels of different pixel groups of non-adjacent pixels are connected to different determination portions. With this arrangement, the individual pixels are connected to corresponding determination portions in a simple, recurring pattern. It should be noted that the pattern does not necessarily have to be recurring or periodic, and may also be a random and/or self-adjusting pattern.

The array may further comprise a plurality of columns, wherein the light reception signals from each pixel of at least one column of the plurality of columns are transmitted to different determination portions. In particular, it is preferable if the light reception signals from each pixel of each column of the plurality of columns are transmitted to different determination portions.

The plurality of pixels may be arranged in an array comprising rows and columns, and each of the four pixels of two adjacent rows and two adjacent columns may be connected to a different determination portion. With this arrangement, the pixels of any pixel blocks constituted by four pixels arranged in a 2×2 arrangement are connected to a different determination portion. This increases the measurement accuracy of the distance measuring device.

The pixels are preferably connected directly to the determination portions. That is, in this arrangement, no switches and in particular no multiplexer is needed between the pixels and the determination portions. This simplifies the control of the distance measuring device, reduces the manufacturing costs and improves product reliability.

The distance measuring device may be configured to measure a distance to the measurement object, a size of the measurement object, a color of the measurement object, a reflectivity of the measurement object, an illumination of the measurement object, and/or a shape of the measurement object.

The distance measuring device may further comprise pixel output control portions configured to selectively forward the light reception signal of each pixel individually. More specifically, the pixel output control portions may be configured to forward the reception signal only of those pixels that receive measurement light. By blocking the signals from those pixels that do not receive measurement light, the signal-to-noise ratio can be increased, thus improving the measurement accuracy.

The distance measuring device may further comprise an evaluation portion that is connected to the plurality of determination portions, the evaluation portion being configured to calculate a measurement value from the characteristic values determined by the determination portions.

The evaluation portion may be configured to detect a plurality of light reception signals from a plurality of objects, to determine a shape according to which the objects are arranged, and/or to determine distances to the respective objects.

Further possible implementations or alternative solutions of the invention also encompass combinations—that are not explicitly mentioned herein—of features described above or below with regard to the embodiments. The person skilled in the art may also add individual or isolated aspects and features to the most basic form of the invention.

Further embodiments, features and advantages of the present invention will become apparent from the subsequent description and dependent claims, taken in conjunction with the accompanying drawings, in which:

BRIEF DESCRIPTION OF THE DRAWINGS

In the figures, like reference numerals designate like or functionally equivalent elements, unless otherwise indicated.

EMBODIMENTS OF THE INVENTION

Figure 1:
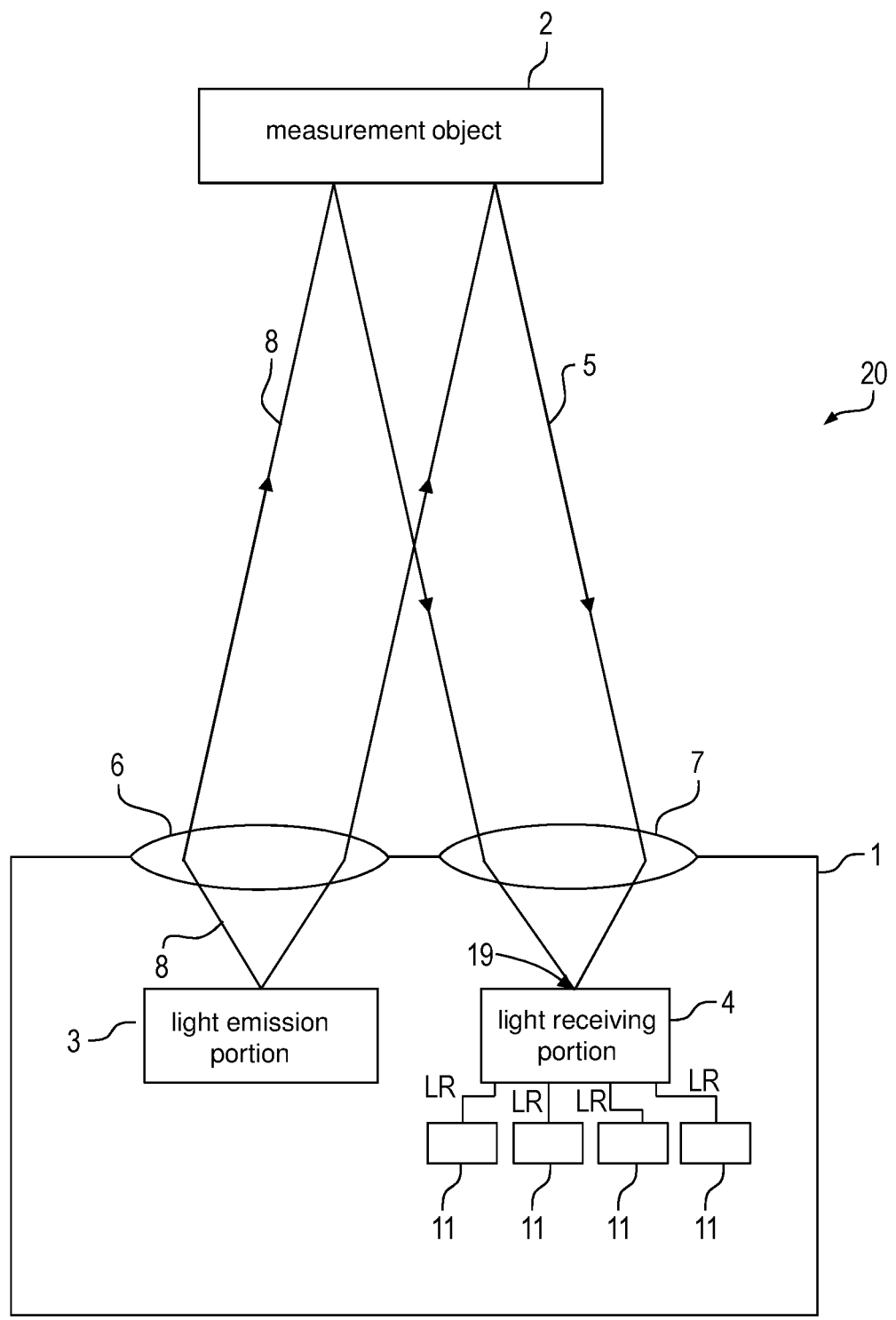
FIG. 1 shows an example of an optical system with a distance measuring device according to a first embodiment.

FIG. 1 shows an example of an optical system 20 including a distance measuring device 1 according to a first embodiment and a measurement object 2. The distance measuring device 1 of this embodiment is configured as a photoelectric sensor and is a distance determination device for determining the distance to the measurement object 2, which is also called "object 2" in the following. The distance of the object 2 from the distance measuring device 1 is a characteristic of the object 2. The distance measuring device 1 comprises a light emission portion 3, a light receiving portion 4, four determination portions 11, a collimator 6 and a converging lens 7.

The light emission portion 3 is a laser source emitting pulsed light at a predetermined frequency and at a predetermined intensity. The light emitted by the light emission portion 3 passes the collimator 6 when exiting the distance measuring device 1. The collimator 6 forms the light emitted by the light emission portion 3 into a substantially parallel light beam, referred to as emitted light 8 below.

When the emitted light 8 reaches the measurement object 2, it is reflected back towards the distance measuring device 1 by the measurement object 2. The emitted light that is reflected by the measurement object 2 forms measurement light 5. In other words, the measurement light 5 is obtained by reflection of the emitted light 8 at the measurement object 2. The measurement light 5 is converged onto a spot 19 of the light receiving portion 4 by the converging lens 7 located at the entrance of the distance measuring device 1. The spot 19 is the surface of the light receiving portion 4 that receives the incident measurement light 5.

Figure 2:
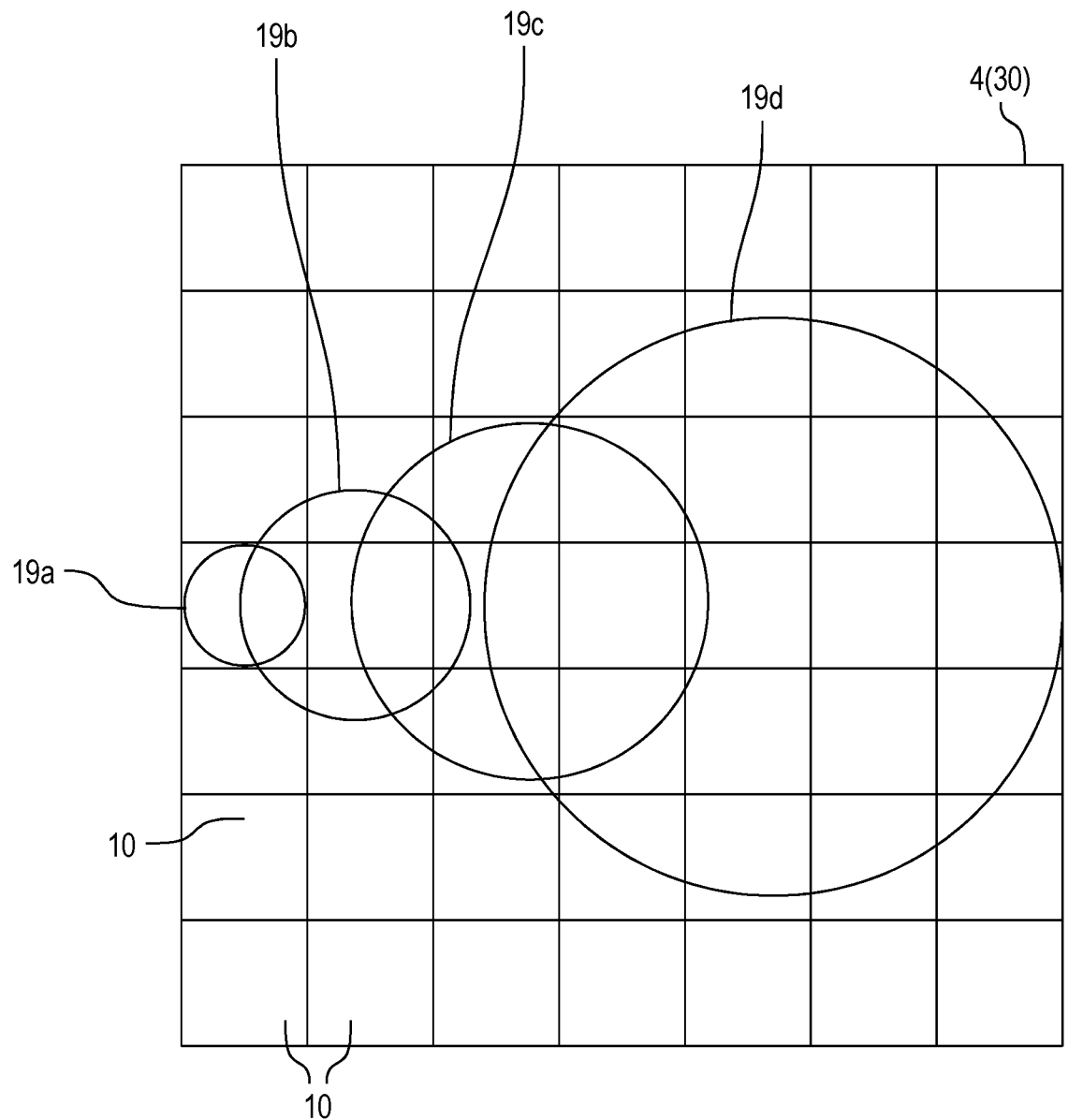
FIG. 2 shows an example of a light receiving portion.

Depending on how far the object 2 is from the distance measuring device 1, the size of the spot 19 may vary. This is illustrated in FIG. 2, which shows an example of a light receiving portion 4. As shown in FIG. 2, the light receiving portion 4 comprises a detection region 30 with a plurality of pixels 10 arranged in an array. The array has seven columns and seven rows, as an example. The detection region 30 is the part of the light receiving portion 4 which can be used to detect incident light, in particular incident measurement light 5. In the present example, each pixel 10 has a square light receiving surface. It should be noted that, for illustrative reasons, the pixels are shown to be contiguous to each other in FIG. 2, but they will ordinarily be not contiguous to each other, but spaced slightly apart, so that signal lines or the like may be arranged between adjacent pixels. Further, in FIG. 2, the pixels 10 are arranged in a pattern with several rows and columns. However, they may also be arranged in a different geometry, for example in a circle, in radial arrangements, in asymmetric arrangements and the like. The same is also true for the drawings discussed below.

The determination portions 11 (FIG. 1) respectively receive light reception signals LR from different pixels 10 of the light receiving portion 4. Possible arrangements of the determination portions 11 will be described below with reference to FIGS. 4, 5 and 6. The light reception signals LR depend on the received measurement light 5. For example, the light reception signals LR depend on the intensity or the amount of the received measurement light 5.

FIG. 2 shows four light spots 19a-19d as examples for the light spot 19 shown in FIG. 1. The substantially circular light spots 19a-19d differ from one another with regard to their diameters. Depending on the diameter of the light spot 19a-19d, a different number of pixels 10 are illuminated by the measurement light 5. The diameter of each light spot 19a-19d varies, e.g. depending on how far the object 2 from which the measurement light 5 was received is located. The smaller the diameter of the light spot 19a-19d, the further away (or the closer, depending on the optical system) the object 2 is located from the distance measuring device 1. In the example of FIG. 2, the light spot 19d is hence obtained from an object 2 that is closer than an object 2 that creates the light spot 19c and so on. As shown in FIG. 2, there may also be a shift in the center of the light spots 19a-19d depending on the distance of the object 2 due to the parallax effect.

The distance to the object 2 can be determined by analyzing a time of flight of the measurement light 5. The time of flight of the measurement light 5 corresponds to the time it takes for the measurement light 5 to travel from the distance measuring device 1 to the object 2 and back to the distance measuring device 1. By measuring a difference in time between the time at which a certain light pulse was emitted by the light emission portion 3 and the time at which this light pulse is received by the light receiving portion 4, the time of flight of the measurement light 5 can be detected. Examples of such time of flight measurements are shown in FIGS. 3A and 3B.

Figure 3A:
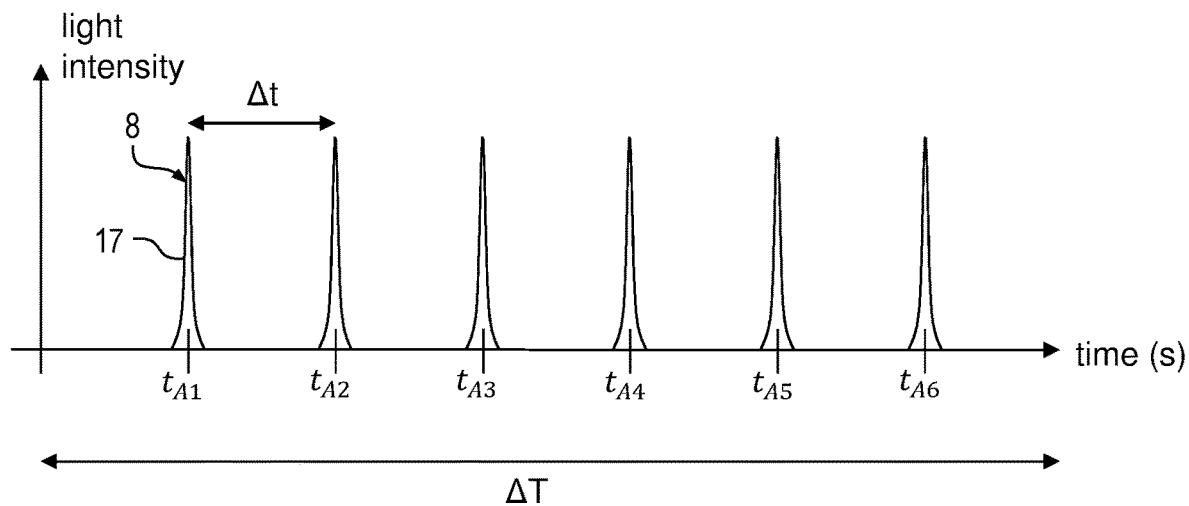
FIG. 3A shows an example of an emitted light intensity over time.
Figure 3B:
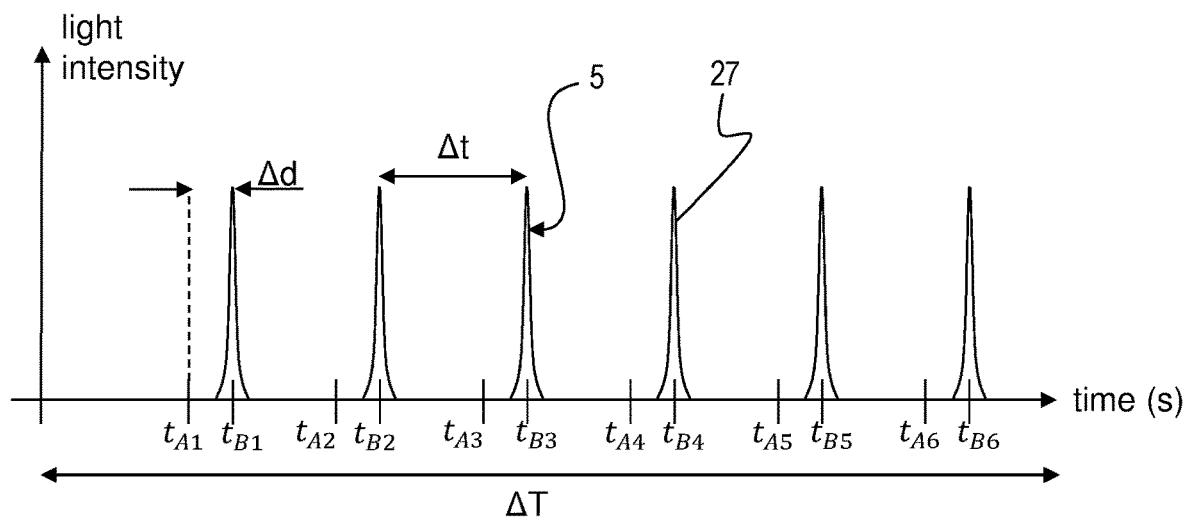
FIG. 3B shows an example of a received light intensity over time.

FIG. 3A shows an example of an intensity of the light emitted by the light emission portion 3 over time. As shown in FIG. 3A, the light emission portion 3 emits pulses of light 8 at regular intervals towards the object 2. That is, a light pulse 17 is emitted at times $t_{A1}$, $t_{A2}$, $t_{A3}$, $t_{A4}$, $t_{A5}$ and tar), which are spaced from one another by a fixed time interval $\Delta t$, during a predetermined time period $\Delta T$. FIG. 3B shows the light intensity of the light received by a pixel 10 of the light receiving portion 4 that receives measurement light 5 as a function of time. The measurement light 5 is received as pulses 27 separated by the same fixed time interval $\Delta t$. The pulses 27 of measurement light 5 are received at times $t_{B1}$, $t_{B2}$, $t_{B3}$, $t_{B4}$, $t_{B5}$ and $t_{B6}$, which are respectively shifted by a time shift $\Delta d$ as compared to the times $t_{A1}$, $t_{A2}$, $t_{A1}$, $t_{A4}$, $t_{A5}$ and $t_{A6}$. The time shift $\Delta d$ results from the time it takes to the light 8 emitted by the light emission portion 3 to travel to the object 2 and back to the distance measuring device 1, plus any other time delays due for instance by the electronics or cables or other means. The time shift $\Delta d$ varies as a function of the distance to the object 2 (time of flight) and can be evaluated to determine the distance to the object 2. In FIG. 3B, the time shift $\Delta d$ is not necessarily depicted in the same scale as the time interval $\Delta t$.

Figure 4A:
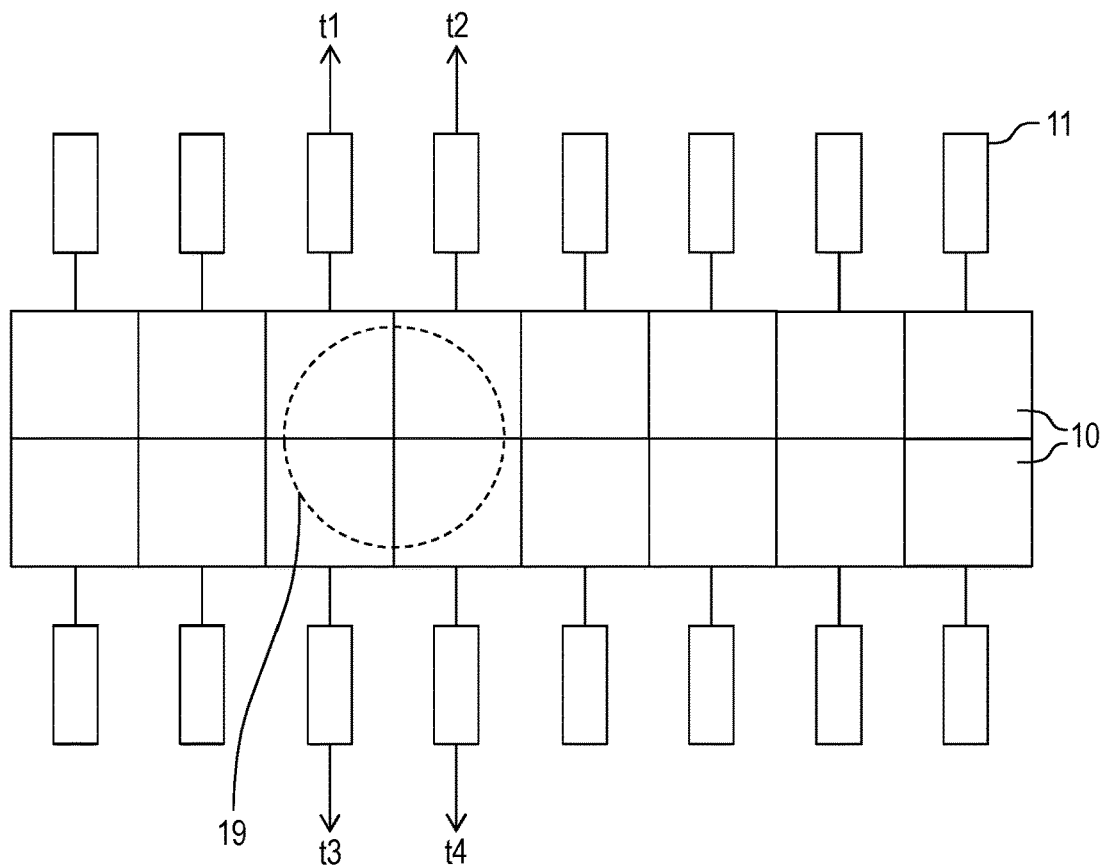
FIG. 4A shows a first comparative example of the arrangement of determination portions.
Figure 4B:
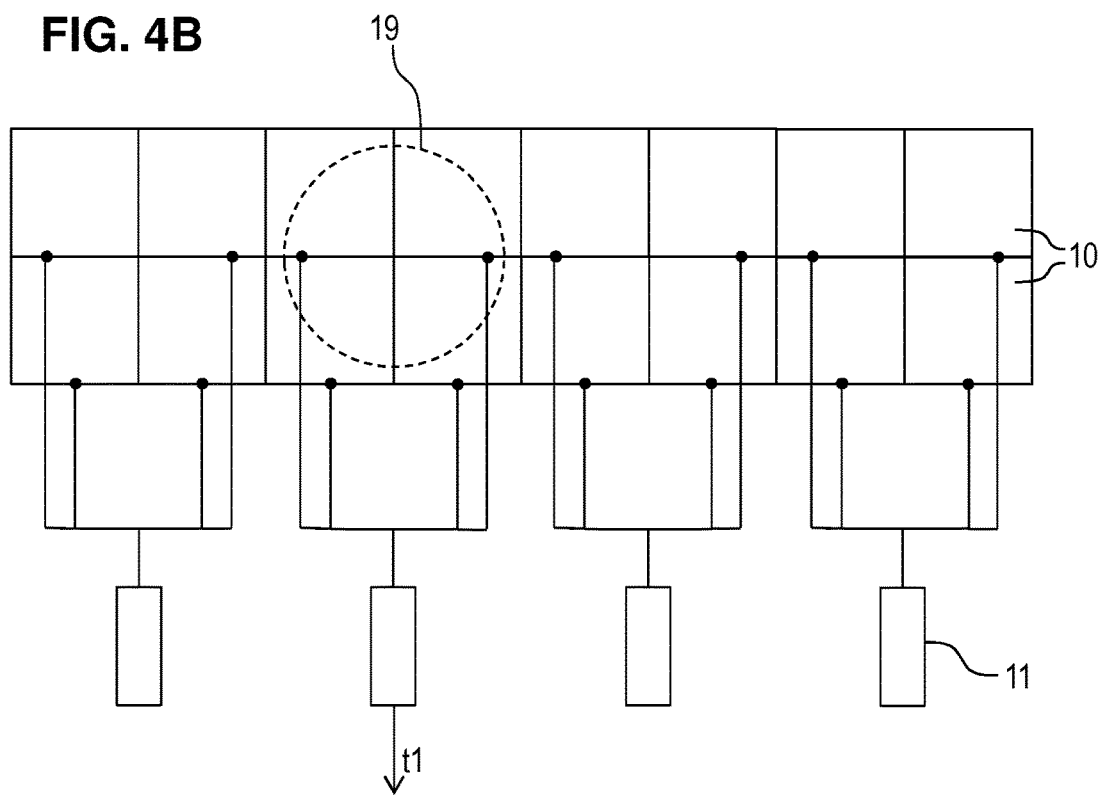
FIG. 4B shows a second comparative example of the arrangement of determination portions.

FIGS. 4A and 4B show comparative examples of the arrangement of the determination portions 11. In the comparative example of FIG. 4A, sixteen pixels 10 are shown. Each pixel 10 is connected to a determination portion 11. Note that in FIG. 4A, only two pixels 10 and one determination portion 11 are provided with a reference sign, however, they may be all identical.

As shown in FIG. 4A, a light spot 19 of received light covers four pixels 10. The determination portions 11 connected to those four pixels 10 receive a light reception signal from the pixel 10 connected thereto and evaluates the light reception signal. In the example of FIG. 4A, each of the four determination portions 11 generates a signal that is indicative of a time of flight $t_1$-$t_4$, which is an example of a characteristic value. That is to say, each determination portion 11 generates a signal that contains information about the time of flight of a light beam emitted by the distance measuring device 1 and received by the pixel 10 associated with that determination portion 11. It should be noted that this functionality of the determination portions 11 is also the same in the examples and embodiments explained below.

The signals indicative of the times of flight $t_1$-$t_4$ are sent to an evaluation portion for processing. For example, the evaluation portion may perform a calculation to determine the average time of the four times of flight $t_1$-$t_4$. Alternatively, it may determine a histogram of all obtained times of flight and determine the distance to the measurement object 2 from that histogram. Also other evaluation processes are possible, in particular when a plurality of light reception signals LR are received from a plurality of measurement objects 2.

Providing one determination portion 11 for each pixel 10, as in the comparative example of FIG. 4A, is particularly space demanding and also results in high power consumption and remarkable potential disturbance and cross-talk among different portions, as a determination portion 11 needs to be arranged next to each pixel 10.

The arrangement of FIG. 4B comprises sixteen pixels 10 and four determination portions 11. One determination portion 11 is connected to a group of four pixels 10 and receives light reception signals therefrom. As shown in FIG. 4B, the light spot 19 covers four pixels 10 of the same determination portion 11. This determination portion 11 generates a signal that is indicative of the time of flight $t_1$ based on the light reception signals from the four pixels 10 connected thereto. From this time of flight $t_1$, an evaluation portion can determine the distance to the measurement object 2.

The arrangement of FIG. 4B is less space consuming than that of FIG. 4A described above. However, the spatial resolution of the distance measuring device 1 is reduced because the arrangement of FIG. 4B does not allow to distinguish between the four pixels 10 connected to the same determination portion 11. A greater resolution means the ability of the distance measuring device 1 to output a greater number of distinct measurement values within a given measurement range. When several pixels 10 share a single determination portion 11, as it is the case in the layout of FIG. 4B, the determination portion 11 does not allow to distinguish between pixels 10 receiving light and pixels 10 which do not receive any light. The measurement accuracy of the distance to the measurement object 2 is hence less accurate when several pixels 10 share one single determination portion 11.

As can be seen from the foregoing, there is a tradeoff between the space needed to provide a large number of determination portions 11 and the measurement accuracy that can be obtained with a large number of determination portions 11.

Figure 5:
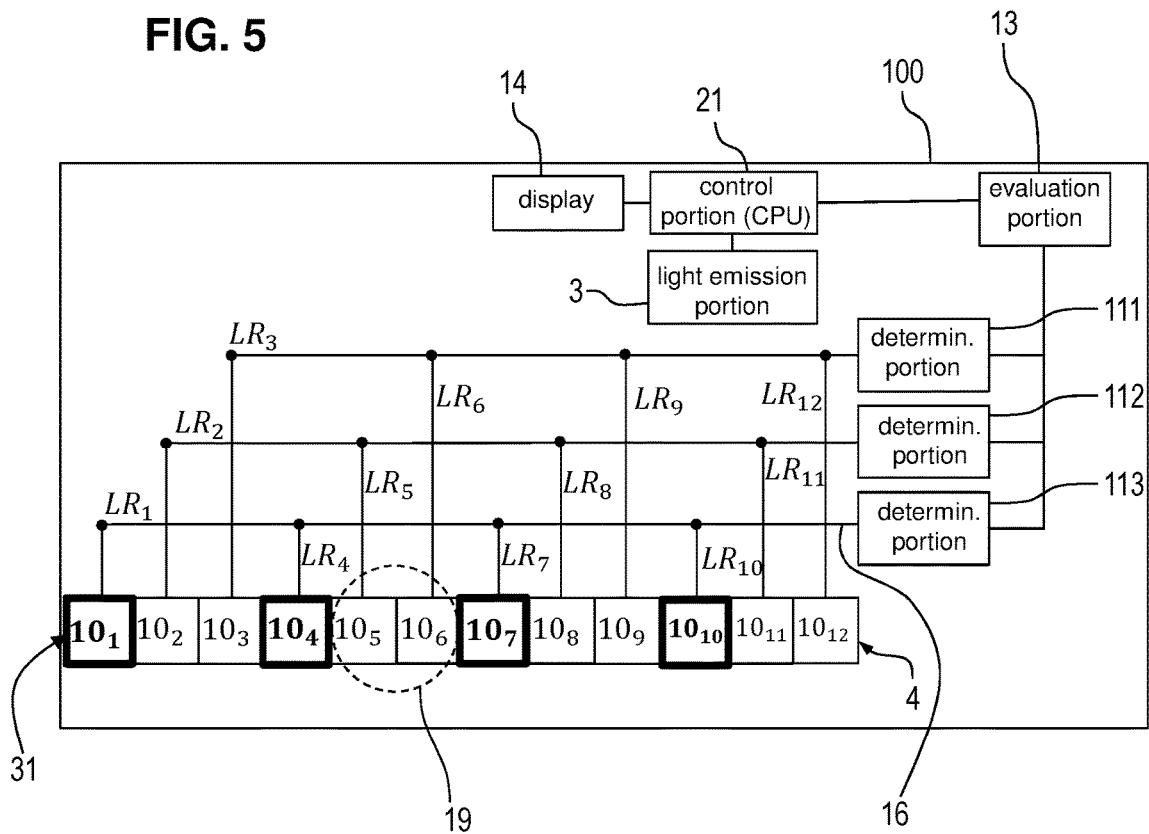
FIG. 5 shows a distance measuring device according to the second embodiment.

The problems encountered with the arrangements of FIGS. 4A and 4B are overcome with the arrangements shown in FIGS. 5, 6 and 8 described below. FIG. 5 shows the distance measuring device 100 according to a second embodiment. In FIG. 5, the distance measuring device 100 comprises a central processing unit (CPU) 1 for controlling the distance measuring device 1.

The detection region 31 of the light receiving portion 4 in FIG. 5 comprises a row of twelve pixels 10 denoted $10_1$-

$10_{12}$. Each pixel $10_1$-$10_{12}$ outputs a light reception signal $LR_1$-$LR_{12}$ in accordance with the measurement light 5 it receives.

The pixels $10_1$, $10_4$, $10_7$ and $10_{10}$ are connected to a determination portion 113 through wiring 16. The light reception signals $LR_1$, $LR_4$, $LR_7$ and $LR_{10}$ emitted by the pixels $10_1$, $10_4$, $10_7$ and $10_{10}$ are transmitted to the determination portion 113 for evaluation. The pixels $10_2$, $10_5$, $10_8$ and $10_{11}$ are connected to a determination portion 112 through further wiring 16. The light reception signals $LR_2$, $LR_5$, $LR_8$ and $LR_{11}$ emitted by the pixels $10_2$, $10_5$, $10_8$ and $10_{11}$ are transmitted to the determination portion 112 for evaluation. The pixels $10_3$, $10_6$, $10_9$ and $10_{12}$ are connected to a determination portion 111 through further wiring 16. The light reception signals $LR_3$, $LR_6$, $LR_9$ and $LR_{12}$ emitted by the pixels $10_3$, $10_6$, $10_9$ and $10_{12}$ are transmitted to the determination portion 111.

The arrangement of the connections of the pixels 10 with the determination portions 111, 112 and 113 is not limited to the arrangement described above, but may be modified as desired. In particular, the arrangement does not have to be fixed, and it may be self-configuring with adaptive connections.

The determination portions 111-113 each output a digital value (e.g. 0101010111) which corresponds to the time of flight of the measurement light 5.

Note that there may be small differences between the values output by the determination portions 111-113 due to the laser pulse width and/or overall time jitter. The determination portions 111-113 may be realized by time-to-digital converters (TDCs), for example. Each TDC may be connected to a plurality of non-adjacent pixels. There may be a delay between the outputs of the different pixels, and in that case, the TDC is stopped when it receives the first light reception signal from one of the pixels connected to it.

The functionality of the pixels 10 and the determination portions 111, 112 and 113 are similar to that in the comparative example explained above. The present embodiment differs from the comparative example explained above in the way the pixels are connected to the determination portions. That is to say, every N-th pixel $10_1$-$10_{12}$ of the row transmits its light reception signal $LR_1$-$LR_{12}$ to the same determination portion 111-113. In the example of FIG. 5, N is 3, but N may also be 2 or 4 or greater. Each of the determination portions 111-113 receives light reception signals $LR_1$-$LR_{12}$ from a group of four non-adjacent pixels $10_1$-$10_{12}$. It should be noted that a "group of non-adjacent pixels" is a group of pixels comprising at least two pixels between which there is no direct path that does not cross another pixel. For example, the group of pixels $10_1$, $10_3$, and $10_5$ and the group of pixels $10_1$, $10_2$, $10_4$, $10_5$ are examples of groups of non-adjacent pixels, whereas the group of pixels $10_1$, $10_2$, and $10_3$ is not a group of non-adjacent pixels.

In the example shown in FIG. 5, the pixels $10_1$, $10_4$, $10_7$, $10_{10}$ constitute a first group of pixels that are all connected to the same determination portion 113. The pixels of this pixel group are indicated by bold lines in FIG. 5. Neighboring pixels of a same pixel group are successive pixels of a pixel group, which are however non-adjacent pixels. For example, the pixels $10_1$ and $10_4$ as well as $10_4$ and $10_7$ are "neighboring pixels" of the first pixel group. However, the pixels $10_4$ and $10_{10}$ are not "neighboring pixels" of the first pixel group because the pixels $10_7$ of the first pixel group lies between them. In other words, the neighboring pixels of each pixel group are not necessarily adjacent to each other.

In the example shown in FIG. 5, N=3 holds, and it can be seen that there are N−1=2 pixels, namely the pixels $10_5$ and $10_6$, of other pixel groups arranged between the pixels $10_4$ and $10_7$, which are neighboring pixels of the pixel group including the pixels $10_1$, $10_4$ and $10_7$, and $10_{10}$.

Each determination portion 111-113 generates and outputs a signal that is indicative of a distance to the object 2 based on the light reception signals $LR_1$-$LR_{12}$ it receives. The determination portions 111-113 are connected to an evaluation portion 13 having the same functionality as explained with regard to the comparative example above. That is, the evaluation portion 13 calculates the distance to the object 2 based on the results (characteristic values, such as time of flight) from the determination portions 111-113. More specifically, the evaluation portion 13 subjects the characteristic values that are output by the determination portions 111-113 to spatial and/or temporal averaging. The evaluation portion 13 may be hard-wired (e.g., as a logic unit) on the same semiconductor chip, like the determination portions 11, but it is also possible to realize the functionality of the evaluation portion 13 with a CPU or FPGA that receives the signals that are output by the determination portions 11 and performs the necessary calculations. The calculated distance to the object 2 is then displayed on a display 14 with which the distance measuring device 1 is provided. Alternatively, it is also possible that the distance to the object 2 is output to another processing portion, such as a controller or the like, or used to control another process.

Thus, the determination portions 111-113 of this embodiment determine characteristic values from the received light reception signals LR (in particular from light reception signals LR received at the same time, i.e. simultaneously) and the evaluation portion 13 calculates and outputs a measurement value from the characteristic values determined by the determination portions 111-113. In the present embodiment, this measurement value is the distance of the distance measuring device 1 from the measurement object 2, which is a characteristic of a measurement object.

In the example of FIG. 5, the light spot 19 covers the pixels $10_5$ and $10_6$, which are adjacent. Accordingly, light reception signals $LR_5$ and $LR_6$ are sent to the respective determination portions 112 and 111 for determining the time of flight and the distance to the object 2 therefrom.

Providing respectively only one determination portion 111-113 for a plurality of pixels $10_1$-$10_{12}$ is advantageous in that space can be saved, power dissipation can be reduced, and signal delays be limited, because fewer determination portions 111-113 need to be arranged within the distance measuring device 100. This also reduces the costs for manufacturing the distance measuring device 100. The arrangement of the determination portions 111-113 of FIG. 5 is thus superior to the arrangement of the determination portions 11 shown in FIG. 4A. Connecting adjacent pixels $10_1$-$10_{12}$ to different determination portion 111-113 is advantageous because the resolution of the distance measuring device 100 can thereby be increased, compared to the case that adjacent pixels 10 are connected to the same determination portion 11. If adjacent pixels 10 are connected to the same determination portion 11, then the determination portion 11 cannot distinguish between a state in which light is incident on only one of the adjacent pixels 10 and a state in which light is incident on two (or more) adjacent pixels 10, thus lowering the resolution. Thus, with the arrangement in FIG. 5, the distance to the object 2 can be determined with a greater accuracy. The arrangement of the determination portions 111-113 of FIG. 5 is thus also superior to the arrangement of the determination portions 11 shown in FIG. 4B.

In an alternative embodiment, at least one of the determination portions 111, 112, 113 is configured to detect not just a single light reception signal LR, but several non-overlapping light reception signals LR. Such a determination portion 111, 112, 113 is in particular capable of recording and storing multiple events.

In the example of FIG. 5, the light spot 19 preferably has a size of three pixels 10 or less. In case that the light spot 19 is larger than the size of three pixels 10, the above stated advantages still hold if the pattern according to which several pixels 10 are connected to the respective determination portions 111-113 is chosen carefully.

Figure 6:
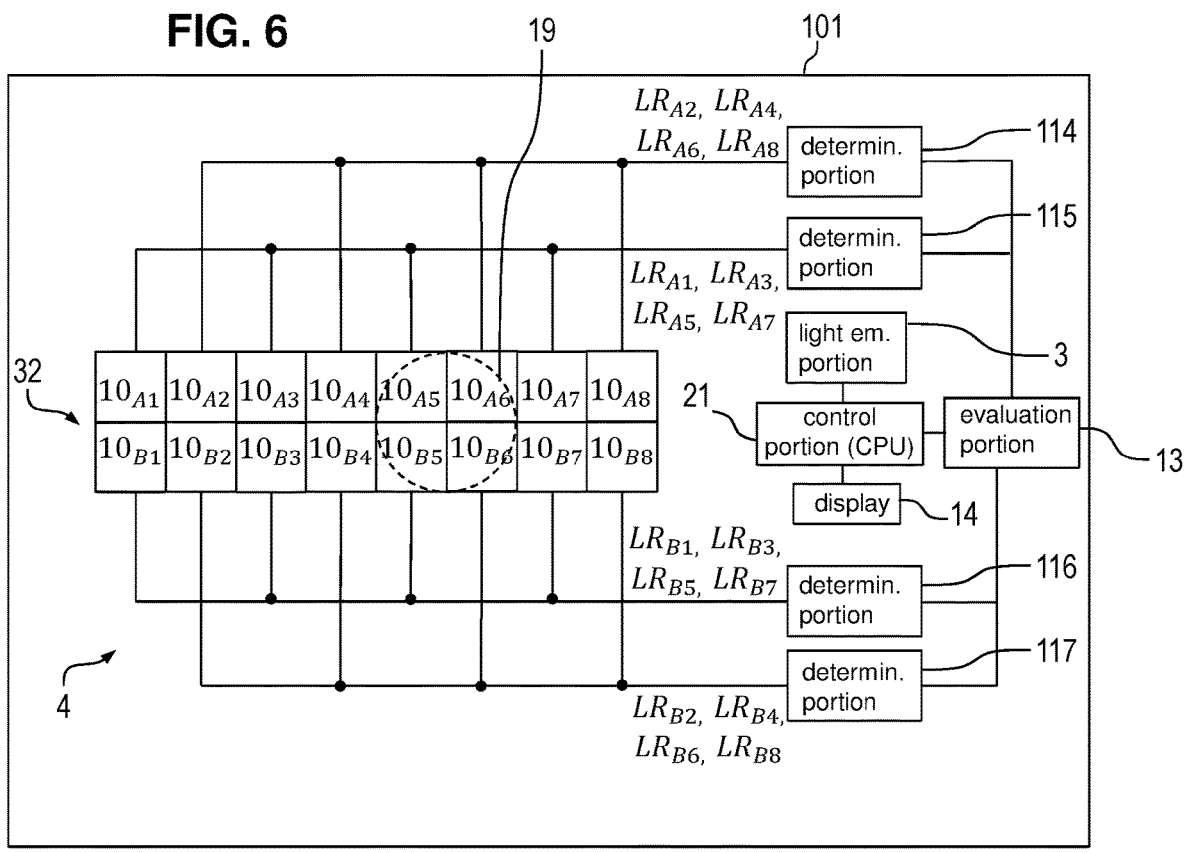
FIG. 6 shows a distance measuring device according to a third embodiment.

FIG. 6 shows a distance measuring device 101 according to a third embodiment. The distance measuring device 101 according to the third embodiment differs from the distance measuring device 100 according to the second embodiment in that its detection region 32 comprises an array of sixteen pixels 10, denoted $10_{A1}$-$10_{A8}$ and $10_{B1}$-$10_{B8}$, the array comprising two rows and eight columns. Every other pixel $10_{A1}$, $10_{A3}$, $10_{A5}$ and $10_{A7}$ of the first row of pixels 10 is connected to a determination portion 115 and transmits its light reception signal $LR_{A1}$, $LR_{A3}$, $LR_{A5}$ and $LR_{A7}$ thereto. The remaining pixels $10_{A2}$, $10_{A4}$, $10_{A6}$ and $10_{A8}$ of the first row of pixels are connected to a determination portion 114 and transmit their light reception signals $LR_{A2}$, $LR_{A4}$, $LR_{A6}$ and $LR_{A8}$ thereto.

Similarly, every other pixel $10_{B1}$, $10_{B3}$, $10_{B5}$ and $10_{B7}$ of the second row of pixels 10 is connected to a determination portion 116 and transmits its light reception signal $LR_{B1}$, $LR_{B3}$, $LR_{B5}$ and $LR_{B7}$ thereto. The remaining pixels $10_{B2}$, $10_{B4}$, $10_{B6}$ and $10_{B8}$ of the second row of pixels are connected to a determination portion 117 and transmit their light reception signals $LR_{B2}$, $LR_{B4}$, $LR_{B6}$ and $LR_{B8}$ thereto.

Any two adjacent pixels 10 of the detection region 32 are thus connected to different determination portions 114-117, to which they feed their light reception signals $LR_{A1}$-$LR_{A8}$ and $LR_{B1}$-$LR_{B8}$.

The function of the determination portions 114-117 is similar to the function of the determination portions 111-113 described in view of FIG. 5 above. In particular, in the example of FIG. 6, the light spot 19 covers the pixels $10_{A5}$, $10_{A6}$, $10_{B5}$ and $10_{B6}$. Accordingly, these pixels $10_{A5}$, $10_{A6}$, $10_{B5}$ and $10_{B6}$ send their respective light reception signals $LR_{A5}$, $LR_{A6}$, $LR_{B5}$ and $LR_{B6}$ to the determination portions 114, 115, 116 and 117 for evaluation.

The arrangement of the determination portions 114-117 is advantageous as compared to the arrangements of the comparative examples of FIGS. 4A and 4B because it is either less space consuming or because a high resolution can be obtained.

In the distance measuring devices 100 and 101, the detection regions 31, 32 respectively comprise twelve and sixteen pixels 10. However, the detection regions 31, 32 could also be much smaller or larger. For example, the detection region 31, 32 can comprise four hundred pixels 10 arranged in an array comprising forty columns and ten rows of pixels. In such an arrangement, ten rows of pixels 10, each row comprising forty pixels, are provided. The rows of pixels 10 are arranged equidistantly from each other at a certain distance, in order to allow wiring of the individual pixels 10 to the determination portions. The four hundred pixels 10 of such a detection region 31, 32 can for example be assigned to eighty different detection portions arranged in the same pattern as the one shown in FIG. 5, for example eight for each one of the ten rows.

In this arrangement, the four adjacent pixels of two adjacent rows and two adjacent columns constitute can be regarded as one "pixel block" of four pixels. For example, in FIG. 6, the pixels $10_{A4}$, $10_{A5}$, $10_{B4}$ and $10_{B5}$ constitute one such pixel block. With the above-described arrangement, the four pixels of any pixel block are connected to four different determination portions, so that a high measurement accuracy can be attained. Similarly, with the above-described arrangement, all pixels of the same column of pixels are connected to different determination portions.

Figure 7A:
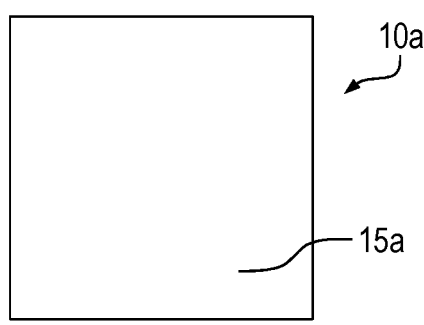
FIGS. 7A-7D show examples of pixels.
Figure 7B:
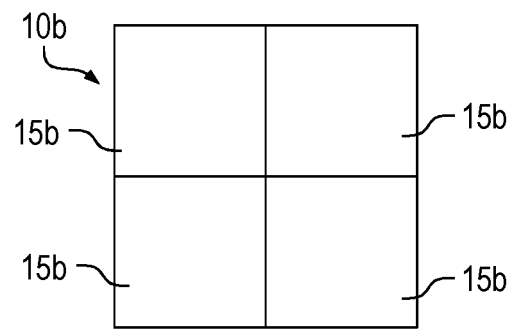
Figure 7C:
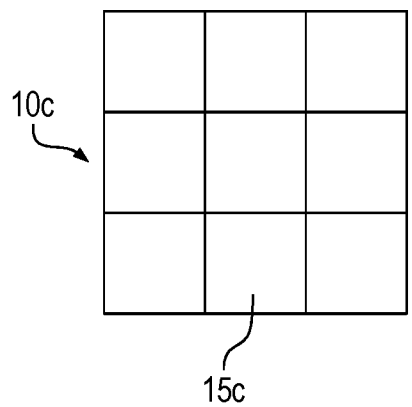
Figure 7D:
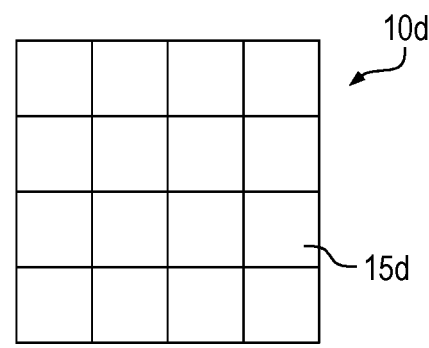

FIGS. 7A-7D show several examples of pixels 10a-10d comprising different numbers of light receiving elements 15a-15d. In FIG. 7A, the pixel 10a comprises a single light receiving element 15a. The light receiving element 15a is formed as a single photon avalanche diode (SPAD). In FIG. 7B, the pixel 10b comprises four SPAD light receiving elements 15b. In the distance measuring device 1, 101, the light reception signal LR of the four light receiving elements 15b of the pixel 10b are all transmitted to the same determination portion 111-117. In FIG. 7C, the pixel 10c comprises nine SPAD light receiving elements 15c. In the distance measuring device 1, 101, the light reception signal LR of the nine light receiving elements 15c of the pixel 10c are all transmitted to the same determination portion 111-117. In FIG. 7D, the pixel 10d comprises sixteen SPAD light receiving elements 15d. In the distance measuring device 1, 100, $10_1$, the light reception signal LR of the sixteen light receiving elements 15d of the pixel 10d are all transmitted to the same determination portion 111-117.

The pixels 10 of the distance measuring devices 1, 100 and 101 of the first, second and third embodiment can all be identical and selected e.g. from the pixels 10a-10d of FIGS. 7A-7D. Alternatively, it is also possible that the pixels 10 of the distance measuring devices 1, 100 and $10_1$ are not all identical. In the latter case, the pixels 10 can also be selected from the pixels 10a-10d of FIGS. 7A-7D.

Figure 8:
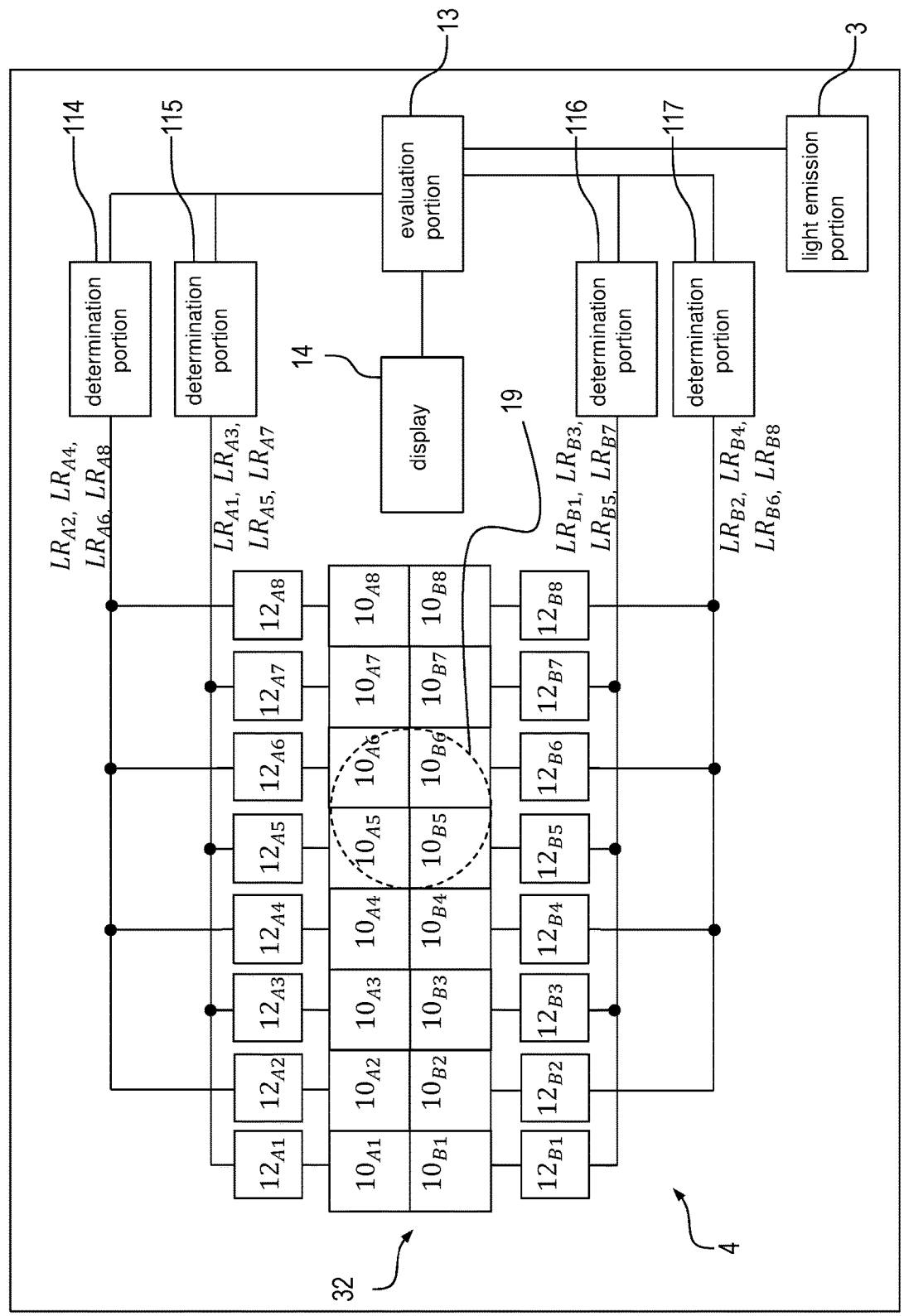
FIG. 8 shows a distance measuring device according to a fourth embodiment.

FIG. 8 shows a distance measuring device 102 according to a fourth embodiment. The distance measuring device 102 according to the fourth embodiment differs from the distance measuring device 101 according to the third embodiment in that each pixel 10 has a pixel output control portion 12 associated thereto. In detail, for each pixel $10_{A1}$-$10_{A8}$ and $10_{B1}$-$10_{B8}$, a pixel output control portion $12_{A1}$-$12_{A8}$ and $12_{B1}$-$12_{B8}$ is provided that is connected to the corresponding pixel $10_{A1}$-$10_{A8}$ and $10_{B1}$-$10_{B8}$. Thus, there is a one-to-one correspondence between pixels and output control portions.

The pixel output control portions $12_{A1}$-$12_{A8}$ and $12_{B1}$-$12_{B8}$ selectively forward the light reception signal LR of each pixel 10 individually. The pixel output control portions $12_{A1}$-$12_{A8}$ and $12_{B1}$-$12_{B8}$ include a switch, such as a transistor, which is controlled depending on whether the corresponding pixel 10 receives measurement light 5 or not. Thus, each pixel output control portion 12 disables the output of the corresponding pixel 10 when the light received by the pixel 10 is only ambient light (i.e. stray light) or noise and enables the output of the corresponding pixel 10 when the light received by the pixel 10 is measurement light 5, i.e. light emitted by the light emission portion 3 that is reflected by the object 2. Accordingly, the determination portions 114-117 only receive light reception signals LR from those pixels 10 that actually receive measurement light 5, but not from those that receive only ambient light. Thereby, the accuracy of the determined distance to the object 2 can be improved.

Although the present invention has been described in accordance with preferred embodiments, it is obvious for the person skilled in the art that modifications are possible in all embodiments. For example, the number of pixels 10 of the light receiving element 4 can be increased or reduced.

Moreover, the pattern according to which several non-adjacent pixels 10 are connected to a single determination portion 111-117 is not limited to those shown in FIGS. 4, 5, 6 and 7. This pattern can be modified as desired as long as adjacent pixels 10 do not send their light reception signals LR to the same determination portion 111-117.

Furthermore, in the foregoing embodiments, a plurality of determination portions are provided, but it should be noted that it is possible to provide a single circuit that performs the above-described functionality of receiving a plurality of light reception signals and determining characteristic values from the light reception signals. In this case, such a single circuit can also be regarded as a "plurality of determination portions".

LIST OF REFERENCE NUMERALS 1 distance measuring device
2 measurement object
3 light emission portion
4 light receiving portion
5 measurement light
6 collimator
7 (converging) lens
8 emitted light beam
10 pixel
$10_1$-$10_{12}$ pixel
$10a$-$10d$ pixel
$10_{A1}$-$10_{A8}$ pixel
$10_{B1}$-$10_{B8}$ pixel
11 determination portion
12 pixel output control portion
$12_{A1}$-$12_{A8}$ pixel output control portion
$12_{B1}$-$12_{B8}$ pixel output control portion
13 evaluation portion
14 display
15 light receiving element
$15a$-$15d$ light receiving element
16 wiring
17 pulse
19 spot
$19a$-$19d$ spot
20 optical system
21 CPU
27 pulse
30-32 detection region
100, $10_1$, $10_2$ distance measuring device
111-117 determination portion
LR light reception signal
$LR_1$-$LR_{12}$ light reception signal
$LR_{A1}$-$LR_{A8}$ light reception signal
$LR_{B1}$-$LR_{B8}$ light reception signal
$t_{A1}$-$t_{A6}$ times
$t_{B1}$-$t_{B6}$ times
$\Delta t$ time period
$\Delta d$ time shift
$\Delta T$ predetermined time period

The invention claimed is:

1. A distance measuring device comprising:
a light emission portion configured to emit light;
a light receiving portion configured to receive measurement light that is emitted by the light emission portion and reflected by a measurement object, the light receiving portion comprising a plurality of pixels configured to output light reception signals that depend on the received measurement light;
a plurality of determination portions configured to receive the light reception signals and to determine characteristic values from the light reception signals;
an evaluation portion that is connected to the plurality of determination portions, the evaluation portion being configured to calculate a distance from the characteristic values determined by the determination portions,
wherein each of the plurality of determination portions is configured to receive the light reception signals only from a plurality of non-adjacent pixels.

2. The distance measuring device according to claim 1, wherein one pixel comprises one or more light receiving elements that are adjacent and the output of which is input into the same determination portion.

3. The distance measuring device according to claim 2, wherein each light receiving element is a single photon avalanche diode.

4. The distance measuring device according to claim 1, wherein each of the plurality of pixels has the same size.

5. The distance measuring device according to claim 1, wherein the pixels include pixels of different sizes.

6. The distance measuring device according to claim 1, wherein:
the plurality of pixels is arranged in an array comprising at least one row,
the pixels of each row constitute N pixel groups,
the pixels of each pixel group are connected to the same determination portion, and
the pixels from each pixel group are arranged such that N-1 pixels of other pixel groups are located between neighboring pixels of the same pixel group.

7. The distance measuring device according to claim 6, wherein the array comprises a plurality of columns, wherein the light reception signals from each pixel of at least one column of the plurality of columns are transmitted to different determination portions.

8. The distance measuring device according to claim 1, wherein
the plurality of pixels is arranged in an array comprising rows and columns, and each of the four pixels of two adjacent rows and two adjacent columns is connected to a different determination portion.

9. The distance measuring device according to claim 1, wherein the pixels are connected directly to the plurality of determination portions.

10. The distance measuring device according to claim 1, further comprising pixel output control portions configured to selectively forward the light reception signal of each pixel individually.

11. The distance measuring device according to claim 10, wherein the pixel output control portions are configured to forward the reception signal only of those pixels that receive measurement light.

* * * * *